United States Patent [19]
Jang

[11] Patent Number: 6,058,063
[45] Date of Patent: May 2, 2000

[54] INTEGRATED CIRCUIT MEMORY DEVICES HAVING REDUCED POWER CONSUMPTION REQUIREMENTS DURING STANDBY MODE OPERATION

[75] Inventor: Hyun-soon Jang, Seoul, Rep. of Korea

[73] Assignee: Samsung Electronics Co., Ltd., Rep. of Korea

[21] Appl. No.: 09/187,544

[22] Filed: Nov. 6, 1998

[30] Foreign Application Priority Data

Nov. 7, 1997 [KR] Rep. of Korea ................ 97-58797

[51] Int. Cl.[7] ................................................ G11C 7/00
[52] U.S. Cl. ................................ 365/227; 365/233
[58] Field of Search ............................. 365/191, 233, 365/226, 227

[56] References Cited

U.S. PATENT DOCUMENTS

| | | | |
|---|---|---|---|
| 4,387,449 | 6/1983 | Masuda | 365/227 |
| 4,718,043 | 1/1988 | Akatsuka | 365/227 |
| 5,526,506 | 6/1996 | Hyatt | 395/438 |
| 5,583,457 | 12/1996 | Horiguchi et al. | 326/121 |
| 5,602,999 | 2/1997 | Hyatt | 395/401 |
| 5,603,009 | 2/1997 | Konishi et al. | 395/492 |
| 5,614,847 | 3/1997 | Kawahara et al. | 326/98 |
| 5,623,453 | 4/1997 | Shinozaki | 365/233 |
| 5,646,902 | 7/1997 | Park | 365/227 |
| 5,663,919 | 9/1997 | Shirley et al. | 365/226 |
| 5,696,729 | 12/1997 | Kitamura | 365/227 |
| 5,708,622 | 1/1998 | Ohtani et al. | 365/233 |
| 5,721,860 | 2/1998 | Stolt et al. | 395/432 |
| 5,926,434 | 7/1999 | Mori | 365/233 |
| 5,926,435 | 7/1999 | Park et al. | 365/233 |

*Primary Examiner*—Son Mai
*Attorney, Agent, or Firm*—Myers Bigel Sibley & Sajovec

[57] ABSTRACT

Integrated circuit memory devices (e.g., SDRAM) include an input buffer and a power reduction control circuit which disables the input buffer in response to an inactive chip select signal (CSB). The input buffer comprises a first differential amplifier having a first input electrically coupled to an input signal line (PX) and a first pull-up transistor electrically connected in series between a pull-up reference node of the first differential amplifier and a power supply signal line (e.g., Vcc). The output of the power reduction control circuit is electrically connected to a gate electrode of the first pull-up transistor. The first pull-up transistor can be turned off in response to an inactive chip select signal (CSB=1), to thereby electrically disconnect the first differential amplifier from its power supply. The input buffer may also comprise a first pull-down transistor electrically connected in series between an output of the first differential amplifier and a reference potential signal line (e.g., GND) and the output of the power reduction control circuit is electrically connected to a gate electrode of the first pull-down transistor.

10 Claims, 3 Drawing Sheets

INTEGRATED CIRCUIT MEMORY DEVICES HAVING REDUCED POWER CONSUMPTION REQUIREMENTS DURING STANDBY MODE OPERATION

FIELD OF THE INVENTION

The present invention relates to integrated circuit devices, and more particularly to integrated circuit memory devices and methods of operating integrated circuit memory devices.

BACKGROUND OF THE INVENTION

Synchronous dynamic random access memory (SDRAM) devices are gradually replacing asynchronous DRAM devices as a preferred memory architecture because of their wider bandwidth of operation and because they can be more efficiently controlled. Unfortunately, many SDRAM devices require considerably more power than DRAM devices, even when operating in standby mode. Thus, the use of SDRAM devices in battery operated circuits may be limited.

As will be understood by those skilled in the art, the amount of power consumed by an SDRAM device can be reduced by using a clock enable signal CKE to induce the standby mode. However, the use of a clock enable signal CKE may result in a delay equivalent to one clock cycle and may require the use of additional I/O pins. Thus, notwithstanding the advantages of using SDRAM devices instead of DRAM devices, there continues to be a need for SDRAM devices having reduced power consumption requirements.

SUMMARY OF THE INVENTION

It is therefore an object of the present invention to provide improved integrated circuit memory devices.

It is another object of the present invention to provide integrated circuit memory devices having reduced power consumption requirements.

It is still another object of the present invention to provide integrated circuit memory devices having more efficient standby mode operating characteristics.

These and other objects, advantages and features of the present invention are provided by integrated circuit memory devices which comprise an input buffer and a power reduction control circuit which disables the input buffer in response to an inactive chip select signal (CSB). According to one embodiment of the present invention, the input buffer preferably comprises a first differential amplifier having a first input electrically coupled to an input signal line (PX) and a first pull-up transistor electrically connected in series between a pull-up reference node of the first differential amplifier and a power supply signal line (e.g., Vcc). Here, the output of the power reduction control circuit is electrically connected to a gate electrode of the first pull-up transistor. Thus, the first pull-up transistor can be turned off in response to an inactive chip select signal (CSB=1), to thereby electrically disconnect the first differential amplifier from its power supply. The input buffer also preferably comprises a first pull-down transistor electrically connected in series between an output of the first differential amplifier and a reference potential signal line (e.g., GND) and the output of the power reduction control circuit is electrically connected to a gate electrode of the first pull-down transistor.

The power reduction control circuit may also comprise a second differential amplifier having a first input electrically connected to a chip select signal line (CSB), a second pull-down transistor having a gate electrode electrically coupled to an output of the second differential amplifier, and a normally-on second pull-up transistor electrically connected in series between a drain of the second pull-down transistor and the power supply signal line. A preferred method of operating an integrated circuit memory device may comprise the steps of transferring data through an input buffer in response to an active chip select signal and disabling transfer of data through the input buffer in response to an inactive chip select signal.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may referred to by the same reference symbols.

Figure 1:
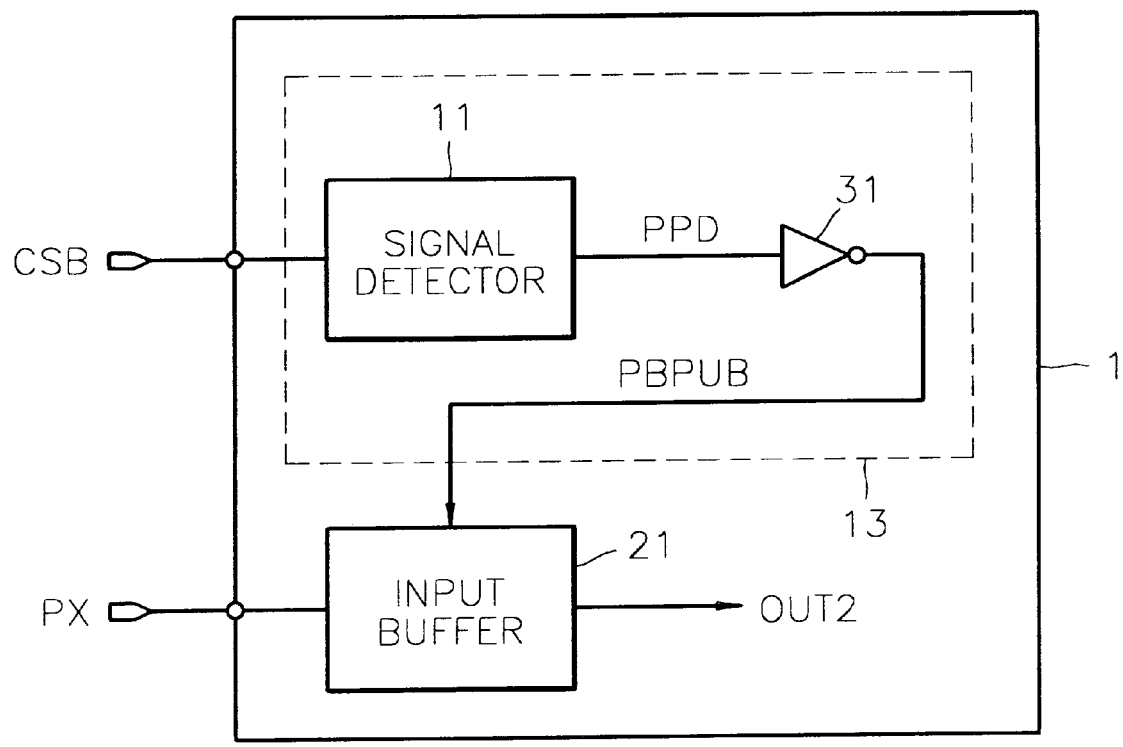
FIG. 1 is an electrical schematic of an integrated circuit memory device according to a first embodiment of the present invention.

Referring now to FIG. 1, a first embodiment of a preferred integrated circuit memory device 1 (e.g., SDRAM) will be described. In particular, the memory device 1 comprises a preferred input buffer 21 and a preferred power reduction control circuit 13. As illustrated, the power reduction control circuit 13 includes a signal detector 11 and a first inverter 31. The power reduction control circuit 13 and performs the function of disabling the input buffer 21 in response to an inactive chip select signal (e.g., CSB=1). For example, when a chip select signal CSB is switched from a logic 0 potential to a logic 1 potential (i.e., 0→1) to trigger an inactive or standby mode of operation in a memory chip(s), a power down signal PPD is driven from a logic 1 to a logic 0 potential (i.e., 1→0). This power down signal PPD is then inverted by the first inverter 31 and provided to a control input of the input buffer 21 as a logic 1 signal (PBPUB), in order to deactivate the input buffer 21 during a standby mode of operation.

Figure 4:
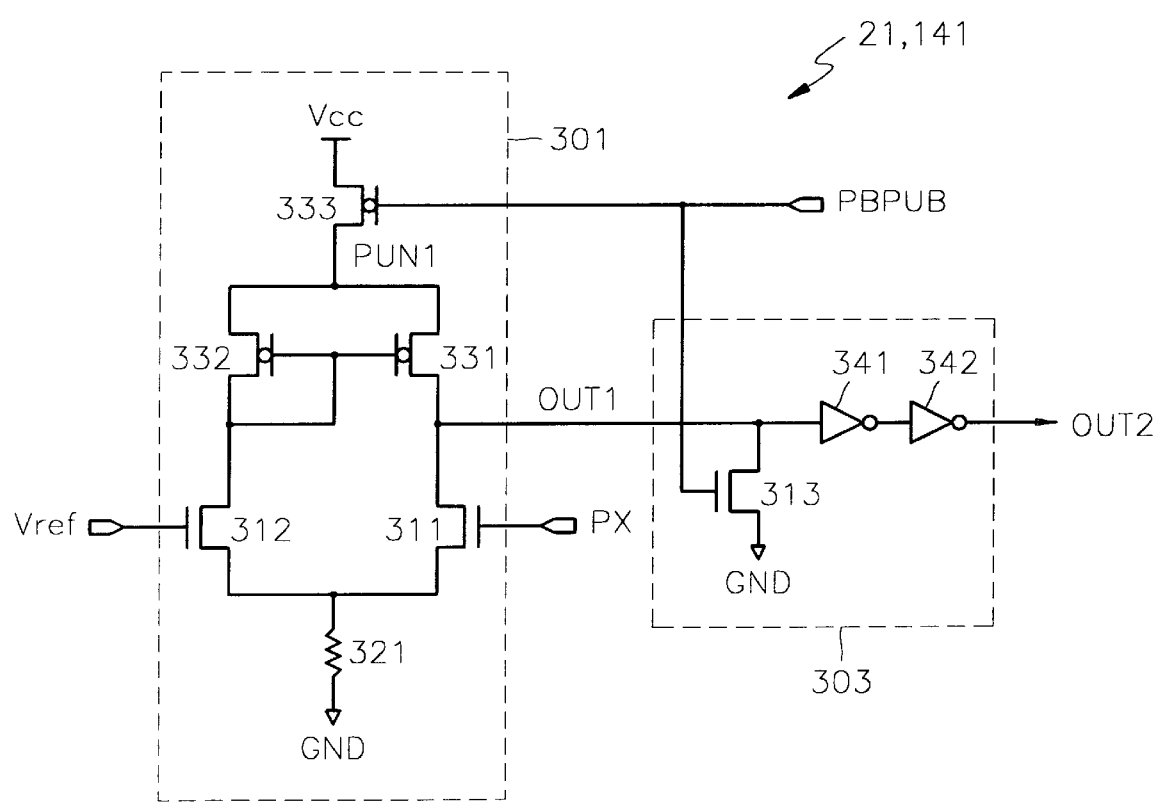
FIG. 4 is an electrical schematic of the input buffer of FIGS. 1–2.

In particular, the input buffer 21 of FIGS. 1 and 4 can be driven into an inactive power-saving mode of operation by disconnecting the input buffer 21 from its source of power (i.e., power supply signal line Vcc) whenever the chip select signal CSB is set to a logic 1 potential (i.e., an inactive state). The illustrated input buffer 21 includes an input circuit 301 and an output circuit 303. The input circuit 301 includes a first differential amplifier having a first input electrically connected to an input signal line PX and a second input electrically connected to a reference signal line Vref. The first differential amplifier includes a pull-down resistor 321, first and second NMOS transistors 311 and 312, and first and second PMOS transistors 331 and 332, connected as illustrated. A first PMOS pull-up transistor 333 is also provided. The first PMOS pull-up transistor 333 is electrically connected in series between a pull-up reference node PUN1 and a power supply signal line Vcc. The output circuit 303 also includes a pair of inverters 341–342, and a first NMOS pull-down transistor 313 electrically connected in series between an output OUT1 of the first differential amplifier and a reference potential signal line (GND). Because the output PBPUB of the power reduction control circuit 13 is provided to a gate electrode of the first PMOS pull-up transistor 333 and a gate electrode of the first NMOS pull-down transistor 313, the power consumed by the input buffer 21 can be substantially reduced whenever the output PBPUB is driven to a logic 1 potential and the first PMOS pull-up transistor 333 is turned off. However, whenever the output PBPUB is driven to a logic 0 potential, the first differential amplifier operates normally by comparing the magnitude of the voltage on the input signal line PX against a reference potential Vref and driving the output OUT1 to a logic 0 potential if the magnitude of the voltage on the input signal line PX is greater than Vref.

Figure 3:
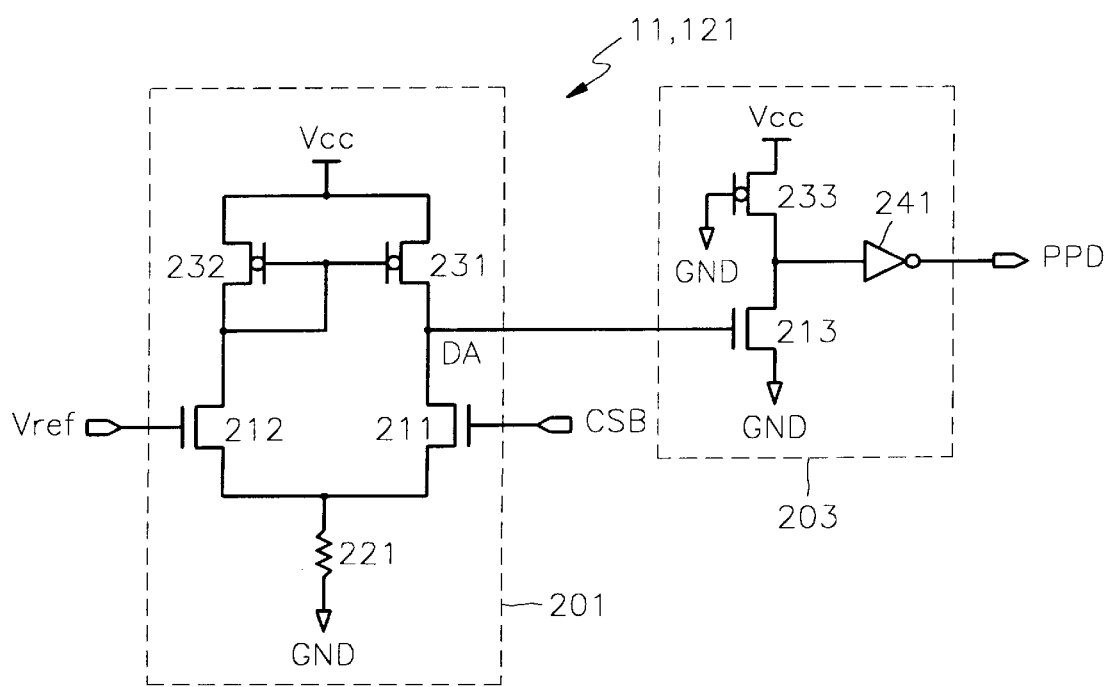
FIG. 3 is an electrical schematic of the signal detector of FIGS. 1–2.

Referring now to FIG. 3, a preferred signal detector 11 generates a logic 0 power down signal PPD whenever the chip select signal CSB is inactive (i.e., logic 1) and generates a logic 1 power down signal PPD whenever the chip select signal CSB is active (i.e., logic 0). In particular, the preferred signal detector 11 includes a second differential amplifier 201 and an output stage 203 which is responsive to an output of the second differential amplifier 201. As illustrated, the second differential amplifier includes a pull-down resistor 221, first and second NMOS transistors 212 and 211, and first and second PMOS transistors 232 and 231, connected as illustrated. The output stage 203 also comprises an NMOS pull-down transistor 213, a normally-on PMOS pull-up transistor 233 and an output inverter 241. The normally-on PMOS pull-up transistor 233 is not as large as the NMOS pull-down transistor 213 which enables the output stage to generate a logic 1 power down signal PPD when the output DA is held at a logic 1 potential. Based on this configuration, the second differential amplifier 201 generates a logic 0 signal at the output DA whenever the magnitude of the chip select signal CSB is greater than the magnitude of the reference voltage Vref. Whenever the output DA is driven to a logic 0 potential upon receipt of an inactive chip select signal CSB, the power down signal PPD is driven from 1→0 and the signal PBPUB is driven to a logic 1 potential to deactivate the input buffer 21. The use of a chip select signal CSB to control standby mode operation also eliminates the need to rely exclusively on a clock enable signal CKE to trigger standby operation, since the use of a clock enable signal may require an additional pin and cause an additional clock cycle delay.

Figure 2:
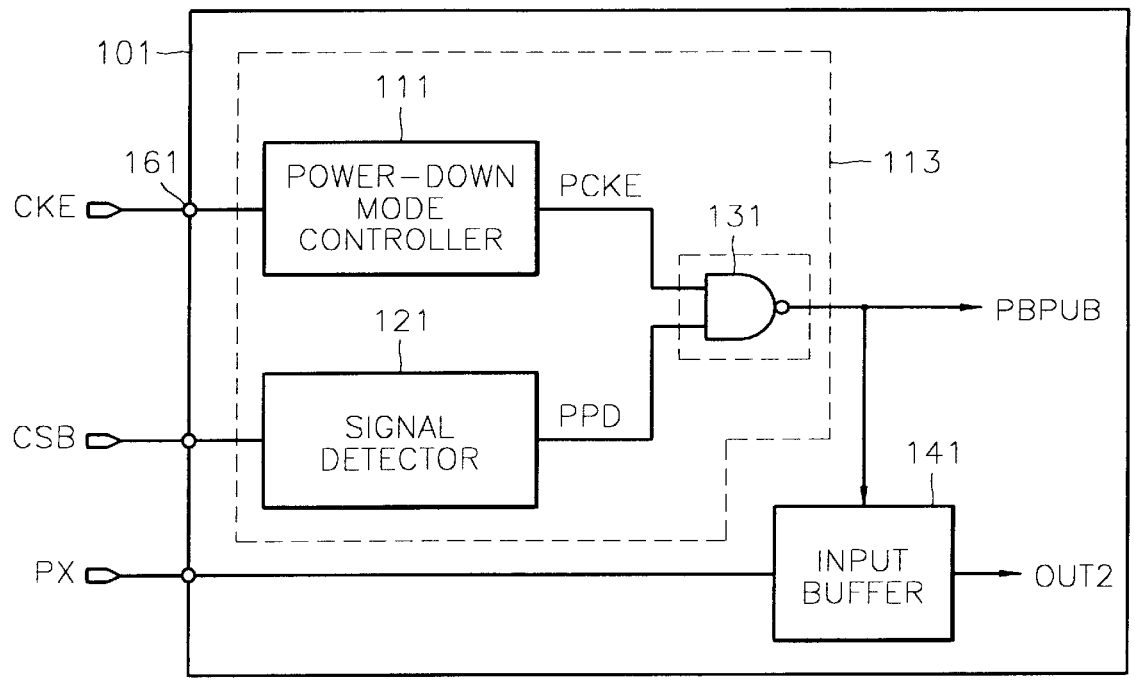
FIG. 2 is an electrical schematic of an integrated circuit memory device according to a second embodiment of the present invention.

Referring now to FIG. 2, an electrical schematic of an integrated circuit memory device 101 according to a second embodiment of the present invention will be described. This memory device 101 is similar to the memory device 1 of FIG. 1, however, a power-down mode controller 111 is also provided in addition to the signal detector 121 (which is similar to the signal detector 11 of FIG. 1). This power-down mode controller 111 generates a power down mode signal PCKE at a logic 0 potential whenever a clock enable signal CKE is inactive (CKE=0) at input 161. Thus, a NAND gate 131 can be used to generate a logic 1 signal at the output PBPUB of the power reduction control circuit 113 if either PCKE or PPD (or both) are set to a logic 0 potential. Accordingly, the input buffer 141 can be disposed in a reduced power consumption mode whenever the chip select signal CSB is set to a logic 1 potential and/or the clock enable signal CKE is set to an inactive level (CKE=0).

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A synchronous semiconductor memory device comprising:

a signal detector for detecting a control signal input from the outside and generating a power-down signal;

a power-down mode controller for generating a power-down mode signal in response to an external clock enable signal;

a logic gate for outputting an activated signal if either of the power-down signal and the power-down mode signal is inactivated, and outputting an inactivated signal if both of the power-down signal and the power-down mode signal are activated; and at least one input buffer operating when the output signal of the logic gate is inactivated, for outputting an externally input signal, and not operating when the output signal of the logic gate is activated.

2. The synchronous semiconductor memory device according to claim 1, wherein the signal detector comprises:

a differential amplifier for comparing the control signal with a predetermined reference voltage and amplifying the comparison result; and a driver for increasing a driving capacity of the output signal of the differential amplifier.

3. The synchronous semiconductor memory device according to claim 2, wherein the driver is a transfer system for outputting a logic '1' if the signal output from the differential amplifier is logic '1,' and outputting a logic '0' if the signal output from the differential amplifier is logic '0'.

4. The synchronous semiconductor memory device according to claim 1, wherein the control signal is a chip select signal for selecting one among a plurality of synchronous semiconductor devices.

5. The synchronous semiconductor memory device according to claim 4, wherein the logic gate is an NAND gate for inputting the output of the signal detector and the output of the power-down mode controller.

6. The synchronous semiconductor memory device according to claim 1, wherein the input buffer comprises:

a differential amplifier for comparing the externally input signal with a preference reference voltage in response to the power-down signal and amplifying the comparison result; and a buffer for buffering the output signal of the differential amplifier.

7. An integrated circuit memory device, comprising:

a data buffer which operates in an active mode upon application of an inactive power reduction control signal thereto and in a reduced power standby mode upon application of an active power reduction control signal thereto, said data buffer comprising:

a first differential amplifier having a first input electrically coupled to an input signal line; and a first pull-up transistor electrically connected in series between a pull-up reference node of said first differential amplifier and a power supply signal line; and a power reduction control circuit which generates the inactive power reduction control signal in response to an inactive clock enable signal or an active chip select signal and generates the active power reduction control signal in response to an active clock enable signal or an inactive chip select signal.

8. The memory device of claim 7, wherein an output of said power reduction control circuit is electrically connected to a gate electrode of said first pull-up transistor.

9. The memory device of claim 8, wherein said data buffer further comprises a first pull-down transistor electrically connected in series between an output of said first differential amplifier and a reference potential signal line; and wherein the output of said power reduction control circuit is electrically connected to a gate electrode of said first pull-down transistor.

10. The memory device of claim 9, wherein said power reduction control circuit further comprises
   a second differential amplifier having a first input electrically connected to a chip select signal line;
   a second pull-down transistor having a gate electrode electrically coupled to an output of said second differential amplifier; and
   a normally-on second pull-up transistor electrically connected in series between a drain of said second pull-down transistor and the power supply signal line.

\* \* \* \* \*

UNITED STATES PATENT AND TRADEMARK OFFICE
CERTIFICATE OF CORRECTION

PATENT NO.    : 6,058,063                                      Page 1 of 1
DATED         : May 2, 2000
INVENTOR(S)   : Hyun-soon Jang It is certified that error appears in the above-identified patent and that said Letters Patent is hereby corrected as shown below:

<u>Title page,</u>
Item [56], References Cited, please add the following:

-- 96-24820    07/20/96    KIPO
       95-20966    07/26/95    KIPO --

Signed and Sealed this

Twenty-second Day of April, 2003

JAMES E. ROGAN
*Director of the United States Patent and Trademark Office*